United States Patent
Asakura et al.

(10) Patent No.: US 10,627,453 B2
(45) Date of Patent: Apr. 21, 2020

(54) INTEGRATED CIRCUIT WITH BUILT-IN STATUS MONITORING UNIT AND POWER SUPPLY DEVICE PROVIDED WITH SAID INTEGRATED CIRCUIT

(71) Applicant: SANYO Electric Co., Ltd., Osaka (JP)

(72) Inventors: Jun Asakura, Hyogo (JP); Kimihiko Furukawa, Hyogo (JP); Tomoyuki Matsubara, Hyogo (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 224 days.

(21) Appl. No.: 15/520,061

(22) PCT Filed: Jul. 3, 2015

(86) PCT No.: PCT/JP2015/003363
§ 371 (c)(1),
(2) Date: Apr. 18, 2017

(87) PCT Pub. No.: WO2016/067486
PCT Pub. Date: May 6, 2016

(65) Prior Publication Data
US 2017/0315181 A1    Nov. 2, 2017

(30) Foreign Application Priority Data
Oct. 28, 2014    (JP) .................. 2014-218788

(51) Int. Cl.
G01R 31/396    (2019.01)
H01M 10/48    (2006.01)
G01R 31/3835    (2019.01)

(52) U.S. Cl.
CPC ........ *G01R 31/396* (2019.01); *H01M 10/482* (2013.01); *G01R 31/3835* (2019.01)

(58) Field of Classification Search
CPC ..... G01R 31/396; G01R 31/36; G01R 19/165
See application file for complete search history.

(56) References Cited

U.S. PATENT DOCUMENTS

| 2009/0087722 A1 | 4/2009 | Sakabe et al. |
| 2012/0146652 A1* | 6/2012 | Aoki ........... G01R 31/396 |
| | | 324/433 |

(Continued)

FOREIGN PATENT DOCUMENTS

| JP | 2013-122452 | 6/2013 |
| JP | 2013-185904 | 9/2013 |
| JP | 2014-196971 | 10/2014 |

OTHER PUBLICATIONS

International Search Report of PCT application No. PCT/JP2015/003363 dated Sep. 8, 2015.

*Primary Examiner* — Tung X Nguyen
*Assistant Examiner* — Feba Pothen
(74) *Attorney, Agent, or Firm* — Wenderoth, Lind & Ponack, L.L.P.

(57) ABSTRACT

A integrated circuit includes a plurality of first connection terminals (410) and second connection terminals (420) for receiving an input of electrical signals, a first detection section, a second detection section, a plurality of switches (432), and a switch control section (430). The first detection section is connected to first connection terminals (410) and obtains input electrical signals. The second detection section is connected to second connection terminals (420). Each switch (432) connects adjacent second connection terminals (420) among second connection terminals (420) to each other, and are connected to each other in series. Switch control section (430) controls to turn off switches (432) and allows electrical signals input to second connection terminals (420) to be input to the second detection section, and controls to turn on any switch among switches (432) to bring (Continued)

adjacent second connection terminals (420) into electrical continuity.

14 Claims, 7 Drawing Sheets

(56) References Cited

U.S. PATENT DOCUMENTS

2013/0234720 A1    9/2013  Tanaka
2014/0141301 A1*   5/2014  Aoki .................. H01M 10/482
                                                              429/90

\* cited by examiner

INTEGRATED CIRCUIT WITH BUILT-IN STATUS MONITORING UNIT AND POWER SUPPLY DEVICE PROVIDED WITH SAID INTEGRATED CIRCUIT

CROSS-REFERENCE TO RELATED APPLICATIONS

This application is a U.S. national stage application of the PCT International Application No. PCT/JP2015/003363 filed on Jul. 3, 2015, which claims the benefit of foreign priority of Japanese patent application No. 2014-218788 filed on Oct. 28, 2014, the contents all of which are incorporated herein by reference.

TECHNICAL FIELD

The present invention relates to an integrated circuit having a built-in status-monitoring unit for monitoring a status of a plurality of battery cells connected to each other in series and a power supply device including the integrated circuit.

BACKGROUND ART

A power supply device including an assembled battery configured of a plurality of battery cells includes a status-monitoring unit for monitoring a status of the battery cells in order to avoid abnormal states such as over-charge and over-discharge of the battery cells. The status-monitoring unit detects data such as a voltage, an electric current, and a temperature from each battery cell as needed, and monitors a status of the battery cell based on the detected data. In particular, since a lithium ion battery can be used in a wide range of SOC (state of charge), an over-discharge region, an overcharge region, and a normal region are disposed near to each other. Therefore, it is preferable that voltage management is carried out more strictly than in the other types of batteries.

Furthermore, it is known that the states of charge of respective battery cells constituting the assembled battery become nonuniform due to variation in charge and discharge or temperature of battery cells. When the states of charges of the battery cells constituting the assembled battery become nonuniform, it is not possible to carry out efficient charge and discharge capable of making the most of the function as the assembled battery. In order to solve such problems, a power supply device provided with a resistance discharge-type discharge circuit that equalizes energy has been proposed (Patent Literature 1).

The discharge circuit according to Patent Literature 1 is connected in parallel to each battery cell, and includes a switch and a discharge resistor. A working status of the switch is controlled by a switch control section. The switch control section is included in the status-monitoring unit. The switch control section is configured to control a working status of the switch depending on a status of the battery cell detected by the status-monitoring unit and to discharge any battery cell. Thus, the state of charge can be adjusted.

In the power supply device of Patent Literature 1, the status-monitoring unit is built in an integrated circuit. The integrated circuit is provided with a terminal to which a measurement line for detecting a voltage is connected, and a terminal to which a signal line for controlling the discharge circuit is connected. As the number of electrical components to be built in the integrated circuit is increased, the number of electrical components to be mounted on the circuit board can be reduced. This configuration contributes to downsizing of a circuit board and cost down.

Furthermore, the power supply device according to Patent Literature 1 includes a first voltage detection circuit and a second voltage detection circuit in order to provide redundancy to the voltage detection of a battery cell. This configuration enables a voltage of one battery cell to be detected by two voltage detection circuits. For example, even if one of the detection circuits fails, the other detection circuit can detect a voltage of the battery cell.

CITATION LIST

Patent Literature

PTL 1: Japanese Patent Application Unexamined Publication No. 2013-185904

SUMMARY OF THE INVENTION

When a status-monitoring unit is built in an integrated circuit as in Patent Literature 1, a dimension of the integrated circuit may be increased. The integrated circuit is required to secure an insulation distance between adjacent connection terminals. Accordingly, when the number of terminals is large, even when the integrated circuit has sufficient space therein, the dimension of the integrated circuit cannot be reduced.

In the power supply device of Patent Literature 1, by sharing wiring of an input signal to a voltage detection circuit, commonality of a terminal to which the first voltage detection circuit is connected and a terminal to which the second voltage detection circuit is connected is achieved. Commonality of terminal reduces the number of terminals provided to the integrated circuit and enables a circuit board to be downsized. In this configuration, however, when disconnection, a short circuit, or the like, occurs in the shared wiring, the electric potential cannot be obtained. In order to improve the reliability of status detection, it is necessary to have a configuration in which wiring connected to the first voltage detection circuit and wiring connected to the second voltage detection circuit are not shared. In such a case, however, terminals of the integrated circuit cannot be shared. Accordingly, the number of terminals is increased, and therefore, the integrated circuit cannot be downsized.

As mentioned above, a conventional configuration has not been able to achieve only one of the reliability of status detection and downsizing of an integrated circuit. The present invention has been made under such circumstances. The main object of the present invention is to provide a technology capable of downsizing an integrated circuit while the reliability of status detection in the integrated circuit having a built-in status-monitoring unit is kept.

In order to solve the above-mentioned problems, an integrated circuit of one aspect of the present invention includes a plurality of first connection terminals and a plurality of second connection terminals, a first detection section, a second detection section, a plurality of switches, and a switch control section. The first detection section obtains electrical signals input to the plurality of first connection terminals. The second detection section is connected to the plurality of second connection terminals. Each switch connects adjacent second connection terminals, among the plurality of second connection terminals, to each other. Furthermore, the plurality of second connection terminals are connected to each other in series. The switch control section controls to turn off the plurality of switches and allows the electrical signals input to the plurality of second connection terminals to be input to the second detection section, and controls to turn on any switch among the plurality of switches and brings adjacent second connection terminals into electrical continuity.

A power supply device according to one aspect of the present invention includes the above-mentioned integrated circuit, an assembled battery, a first filter unit, and a plurality of discharge resistors. The assembled battery includes a plurality of battery cells. The first filter unit obtains electrical signals from the plurality of battery cells, attenuates a predetermined frequency component of the signals, and outputs the signals to the plurality of first connection terminals. The plurality of discharge resistors connect the plurality of battery cells to the plurality of second connection terminals, respectively. The switch control section controls to turn on any switch among the plurality of switches, thereby discharging a battery cell corresponding to the switch via the plurality of discharge resistors. Furthermore, the switch control section controls to turn off a plurality of switches, thereby allowing electrical signals obtained from the plurality of battery cells to be input to the second detection section via the plurality of discharge resistors.

Furthermore, a power supply device according to another aspect of the present invention includes the above-mentioned integrated circuit, an assembled battery, a first filter unit, and a discharge unit. The assembled battery includes a plurality of battery cells. The first filter unit obtains electrical signals from the plurality of battery cells, attenuates a predetermined frequency component of the signals, and output the signals to the plurality of first connection terminals. The discharge unit includes a plurality of semiconductor switches connected in parallel to the plurality of battery cells, and a plurality of signal lines for controlling operations of the plurality of semiconductor switches. The plurality of signal lines are connected to the output terminal of a corresponding battery cell and to corresponding terminals of the second connection terminal, respectively. The switch control section controls to turn on any switch among the plurality of switches and controls to turn on a corresponding semiconductor switch, and the switch control section controls to turn off a plurality of switches and allows electrical signals obtained from the plurality of battery cells to be input to the second detection section via the plurality of signal lines.

One aspect of the present invention includes switches for connecting adjacent connection terminals of the integrated circuit. The switches are connected to each other in series. Thereby, a terminal for controlling to discharge a battery cell and a terminal for detecting a voltage can be shared. Therefore, even in comparison with a configuration of the integrated circuit having a built-in status-monitoring unit, it is possible to suppress the increase in the number of terminals of the integrated circuit, and to downsize the integrated circuit. In addition, since terminals for detecting a voltage are not shared and sharing of the wiring portions can be reduced, the first detection section and the second detection section can secure the redundancy in voltage detection. Therefore, the integrated circuit according to one aspect of the present invention can keep reliability in voltage detection and can downsize the integrated circuit.

DETAILED DESCRIPTION OF THE PREFERRED EMBODIMENT

Figure 1:
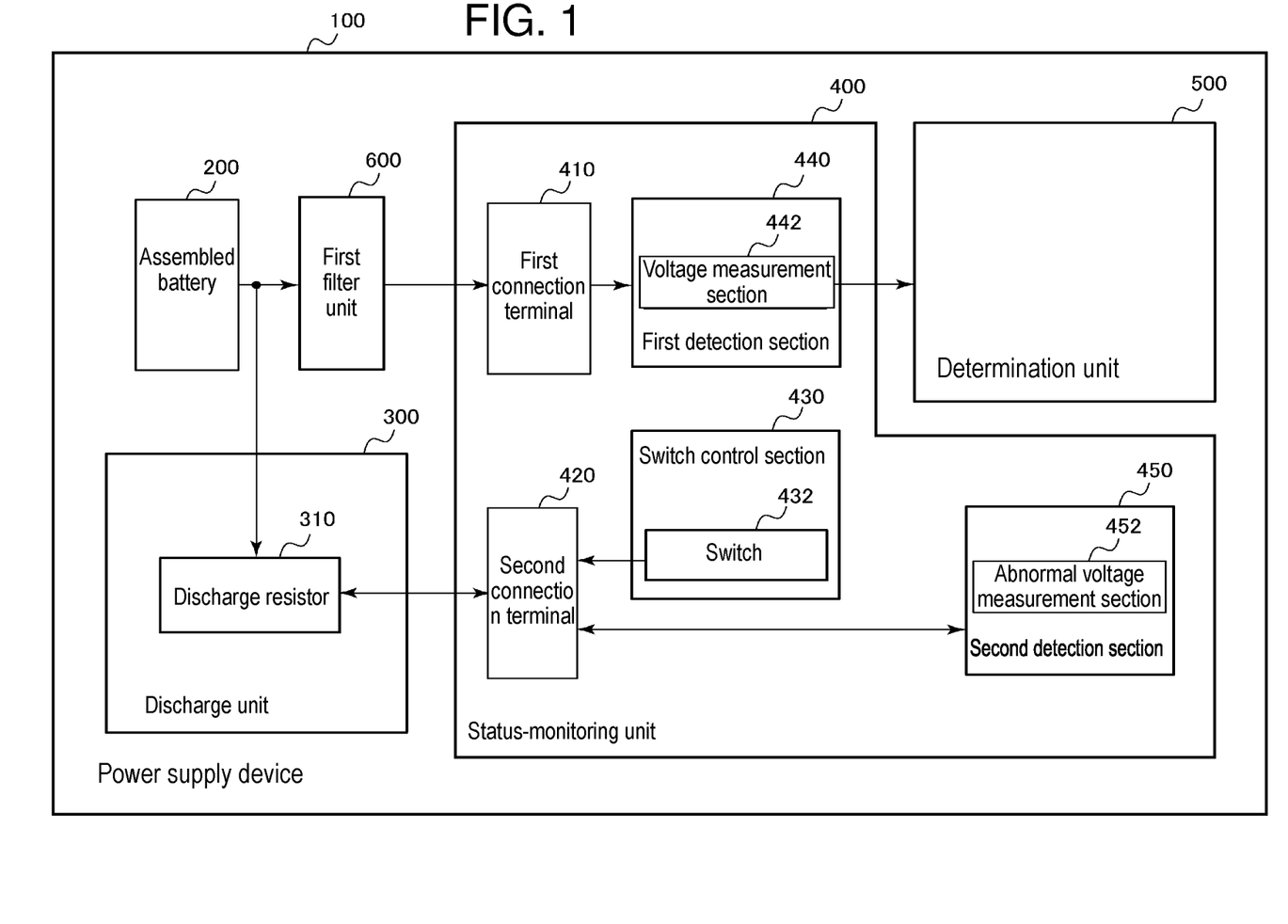
FIG. 1 is a block diagram of a power supply device according to a first exemplary embodiment of the present invention.

With reference to FIG. 1, an outline of an exemplary embodiment of the present invention is described. FIG. 1 is a diagram schematically showing an outline of power supply device 100 according to a first exemplary embodiment of the present invention. Power supply device 100 according to the first exemplary embodiment includes assembled battery 200 provided as a power supply to be mounted on a vehicle, and status-monitoring unit 400 for monitoring a status of assembled battery 200. Status monitoring unit 400 includes first connection terminal 410 and second connection terminal 420 to which an analog signal as an electrical signal is input, first detection section 440 connected to first connection terminal 410, and second detection section 450 connected to second connection terminal 420. Status monitoring unit 400 is further provided with switch control section 430 including switch 432 connected to second connection terminal 420. Switch control section 430 controls a working status of switch 432.

First filter unit 600 is provided between assembled battery 200 and first connection terminal 410. First filter unit 600 is a low-pass filter. First filter unit 600 outputs the input analog signal with its high-frequency component attenuated. The output from first filter unit 600 is input to first detection section 440 via first connection terminal 410. First detection section 440 includes voltage measurement section 442 measuring a voltage of assembled battery 200 using the input analog signal.

Discharge unit 300 is provided between assembled battery 200 and second connection terminal 420. Switch control section 430 controls a working status of switch 432, such that an impedance can be changed and an amount of an electric current flowing in discharge unit 300 can be controlled. When the amount of an electric current flowing in discharge unit 300 is increased, assembled battery 200 can be discharged via discharge unit 300. When the amount of an electric current flowing in discharge unit 300 is decreased, an electric potential input as an analog signal can be obtained while a voltage drop in discharge unit 300 can be reduced. Second detection section 450 detects a status of assembled battery 200 from the electric potential (analog signal) of second connection terminal 420 input to second connection terminal 420 in a state in which switch control section 430 decreases the amount of electric current flowing into discharge unit 300.

Furthermore, second detection section 450 can be configured to include abnormal voltage measurement section 452 for detecting an abnormal voltage of an assembled battery from an analog signal input to second connection terminal 420. Abnormal voltage measurement section 452 detects an abnormal state such as an over-charge state or an over-discharge state of assembled battery 200 using an analog signal input to second connection terminal 420. Note here that in the following description, an example of a configuration in which second detection section 450 includes abnormal voltage measurement section 452 is described. However, abnormal voltage measurement section 452 is not necessarily included. Although not shown, second detection section 450 can be configured to include a voltage measurement section for detecting a voltage of an assembled battery from an analog signal input to second connection terminal 420 instead abnormal voltage measurement section 452.

Figure 2:
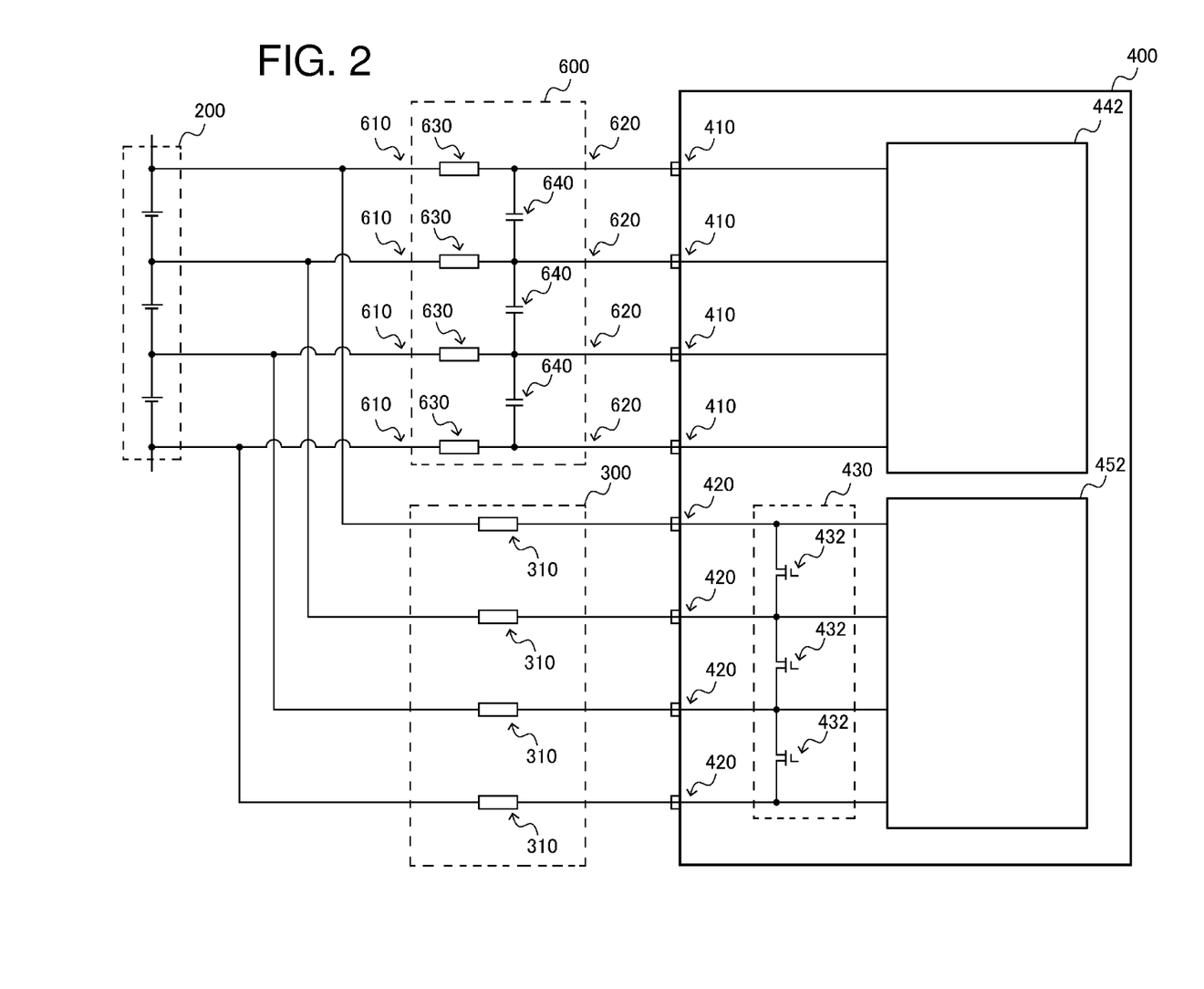
FIG. 2 is a circuit diagram of a power supply device of one aspect for embodying the power supply device of FIG. 1.

FIG. 2 illustrates power supply device 100 of one aspect for embodying the power supply device shown in FIG. 1. Assembled battery 200 includes three battery cells connected in series. Power supply device 100 includes four measurement lines for obtaining an analog signal. The measurement lines are connected to output terminals of the battery cells, respectively. First filter unit 600 includes a plurality of input terminals 610 and a plurality of output terminals 620, first filter resistors 630 for respectively connecting input terminals 610 to corresponding output terminals 620, and first capacitors 640 respectively connected to adjacent output terminals 620. Each of first capacitors 640 is connected between first filter resistor 630 and output terminal 620. First capacitors 640 are connected to each other in series. With this configuration, first filter unit 600 can attenuate a high-frequency component of an analog signal input to each input terminal 610 and output the signal from output terminal 620. The frequency component (cutoff frequency) attenuated by first filter unit 600 can be set by the circuit constants of first filter resistor 630 and first capacitor 640 constituting first filter unit 600.

In the power supply device shown in FIG. 2, discharge unit 300 includes a plurality of discharge resistors 310. Each discharge resistor 310 has a node between an output terminal of each battery cell and each input terminal 610 of first filter unit 600, and obtains an analog signal, which is obtained from each of the battery cells via a measurement line, without via first filter unit 600.

Status-monitoring unit 400 includes a plurality of first connection terminals 410 to which output from first filter unit 600 is input and a plurality of second connection terminals 420 to which discharge resistors 310 of discharge unit 300 are connected. Voltage measurement section 442 is connected to the plurality of first connection terminals 410. Voltage measurement section 442 detects a terminal voltage of the corresponding battery cell from a potential difference of first connection terminals 410. Abnormal voltage measurement section 452 is connected to a plurality of second connection terminals 420. Abnormal voltage measurement section 452 detects over-charge or over-discharge of the battery cell based on the electric potential of second connection terminals 420. Furthermore, abnormal voltage measurement section 452 is designed to have high impedance, and decreases an amount of electric current flowing in discharge resistor 310 of discharge unit 300 when an analog signal is obtained.

Furthermore, status-monitoring unit 400 includes a plurality of switches 432 for connecting terminals constituting second connection terminal 420, and switches 432 are connected each other in series. In the circuit diagram of FIG. 2, a plurality of switches 432 are cascaded. When any switch 432 is controlled to be on, terminals to which on-state switch 432 is connected are brought into electrical continuity. When the terminals to which switches 432 are connected are brought into electrical continuity, an electric current path having a low impedance is formed.

Therefore, when switch 432 of switch control section 430 is controlled to be on, an electric current flowing in corresponding discharge resistor 310 of discharge unit 300 is increased. In other words, when switch 432 of switch control section 430 is controlled to be on, the output terminal of the corresponding battery cell of assembled battery 200 is connected at low impedance, and the corresponding battery cell is discharged via discharge resistor 310. On the other hand, when switch 432 is controlled to be off, since the terminals constituting second connection terminal 420 are connected at high impedance, an electric current hardly flows in discharge resistor 310. Substantially only an analog signal corresponding to a voltage is input.

Note here that as shown in FIG. 2, since first filter unit 600 can be achieved by the combination of circuit elements mounted on the circuit board instead of IC, input terminal 610 or output terminal 620 as a member is not necessarily provided. For example, an output terminal of a battery cell and first filter unit 600, or first filter unit 600 and first connection terminal 410 of status-monitoring unit 400 may be seamlessly connected to each other by lead wire or a pattern of the circuit board. A person skilled in the art can understand that input terminal 610 or output terminal 620 of this description also includes such a configuration.

Figure 3:
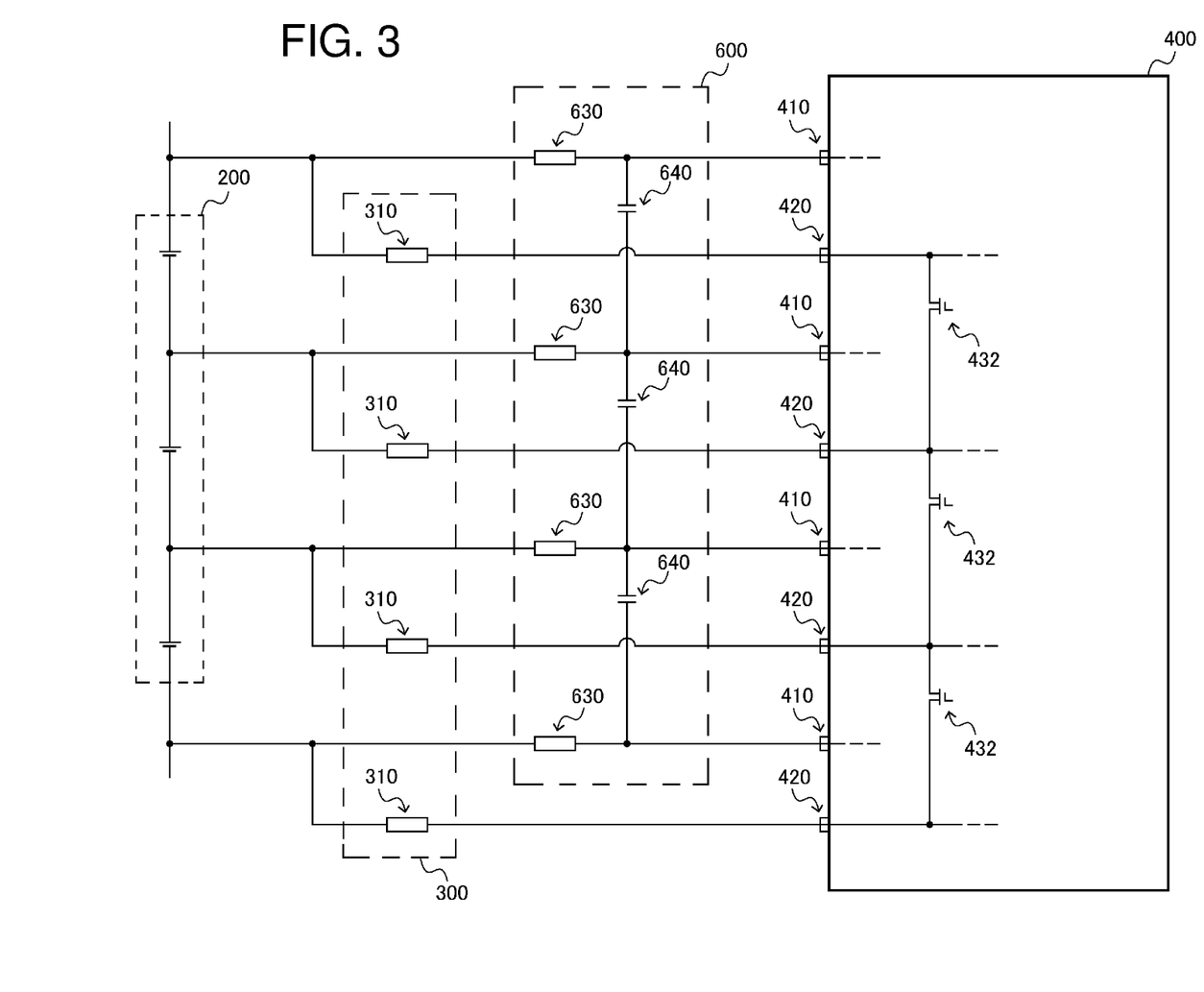
FIG. 3 is a circuit diagram that is an equivalent circuit of the circuit diagram shown in FIG. 2, illustrating arrangement of terminals.

FIG. 3 is a diagram for illustrating arrangement of terminals of status-monitoring unit 400 shown in FIG. 2. The circuit diagrams of FIGS. 2 and 3 are equivalent to each other as a circuit diagram, but in an actual circuit board or a semiconductor integrated circuit, wiring needs to be devised. Specifically, when the potential difference of neighboring wiring is increased, it is necessary to increase an insulation distance. Therefore, wiring is preferably provided such that a potential difference is reduced as small as possible. Accordingly, status-monitoring unit 400 is composed of ASIC, as shown in FIG. 3, terminals of first connection terminal 410 and terminals of second connection terminal 420 are alternately disposed.

With the above-mentioned configuration, depending on a working status of a plurality of switches 432 of switch control section 430, an amount of electric current flowing in each discharge resistor 310 of discharge unit 300 can be changed. Therefore, with this configuration, discharging via discharge unit 300 and obtaining of an analog signal for voltage detection can be achieved by a common electric current path, and increase of the number of terminals of the status-monitoring unit 400 can be suppressed.

Note here that in the first exemplary embodiment shown in FIGS. 2 and 3, an analog signal that has passed through the first filter unit is input to first connection terminal 410, but an analog signal that has not passed through a low-pass filter is input to second connection terminal 420. Therefore, the power supply device shown in FIGS. 2 and 3 is configured to have voltage measurement section 442 and abnormal voltage measurement section 452, and is configured to have abnormal voltage measurement section 452 in a second detection section connected to second connection terminal 420. Since an object of abnormal voltage measurement section 452 is to detect an abnormal state, it is not necessary to detect precise voltage value. In this configuration, although an analog signal filtered by a first filter unit is input to voltage measurement section 442 that requires high accuracy, an over-charge state, an over-discharge state, or the like, can be detected by voltage measurement section 442 and abnormal voltage measurement section 452.

Next, a control content of switch control section 430 is described. In a first exemplary embodiment, status-monitoring unit 400 specifies a battery cell to be discharged based on the detection results of voltage measurement section 442. Switch control section 430 controls to turn on switch 432 corresponding to the battery cell specified by status-monitoring unit 400, and allows the battery cell to be discharged. At this time, since switches 432 are cascaded, when adjacent switches 432 are controlled to be on simultaneously, there may be a problem that the number of discharge resistors 310 and that of battery cells are not matched. Specifically, when only one switch 432 is controlled to be on, a discharge current flowing in discharge unit 300 flows in one battery cell and two discharge resistors 310. On the other hand, adjacent switches 432 are controlled to be on simultaneously, discharge current flowing in discharge unit 300 flows in two battery cells and two discharge resistors 310. Since a flowing amount of electric current of the discharge current is determined depending on a voltage of a battery and a resistance value of a discharge resistor, when the number of the discharge resistors and the number of cells to be discharged are not matched, equalization control of the state of charge of the battery cell cannot be managed only by on/off of switch 432. Furthermore, there is also a problem that switch 432 is controlled to be on over multiple stages, the discharge current become too large. Therefore, in the power supply device of the first exemplary embodiment of the present invention, it is necessary to prohibit adjacent switches 432 from being turned on simultaneously.

In view of such problems, in a power supply device of the first exemplary embodiment of the present invention, a plurality of switches 432 are divided into two groups and controlled for each group, and adjacent switches 432 belong to different groups from each other. Battery cells constituting assembled battery 200 are subjected to equalization processing for each corresponding group. With such a processing method, adjacent switches 432 can be prohibited from being turned on simultaneously. The switches belonging to two groups are alternately controlled in a time-division manner, and controlled such that equalization control is not hindered while two groups are prohibited from being turned on simultaneously.

Figure 4:
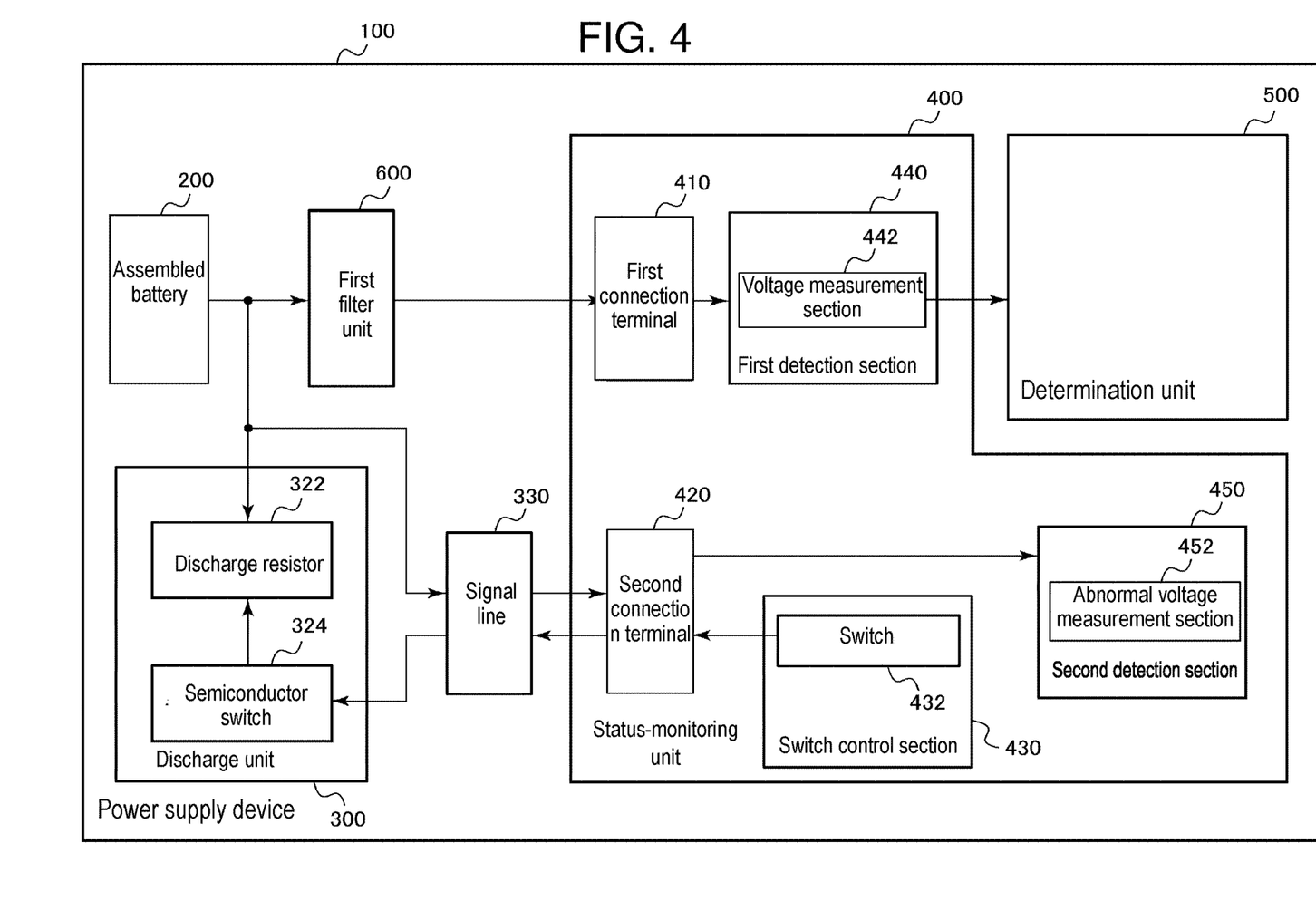
FIG. 4 is a block diagram of a power supply device according to a second exemplary embodiment of the present invention.

Next, with reference to FIG. 4, an outline of the other exemplary embodiment of the present invention is described. Note here that the same references numerals are given to the same component elements as those in the above-mentioned first exemplary embodiment, and detailed description thereof is omitted herein.

FIG. 4 is a view schematically showing an outline of power supply device 100 according to a second exemplary embodiment of the present invention. In power supply device 100 according to the second exemplary embodiment, discharge unit 300 includes discharge resistor 322 and semiconductor switch 324. When semiconductor switch 324 is controlled to be on, assembled battery 200 is discharged via discharge resistor 322. Power supply device 100 includes signal line 330 for controlling semiconductor switch 324. Signal line 330 is connected to the measurement line and second connection terminal 420, and controls a working status of a semiconductor switch by a voltage change. Furthermore, the signal line is configured to obtain an analog signal from assembled battery 200 via the measurement line, and to input the analog signal to second connection terminal 420.

Figure 5:
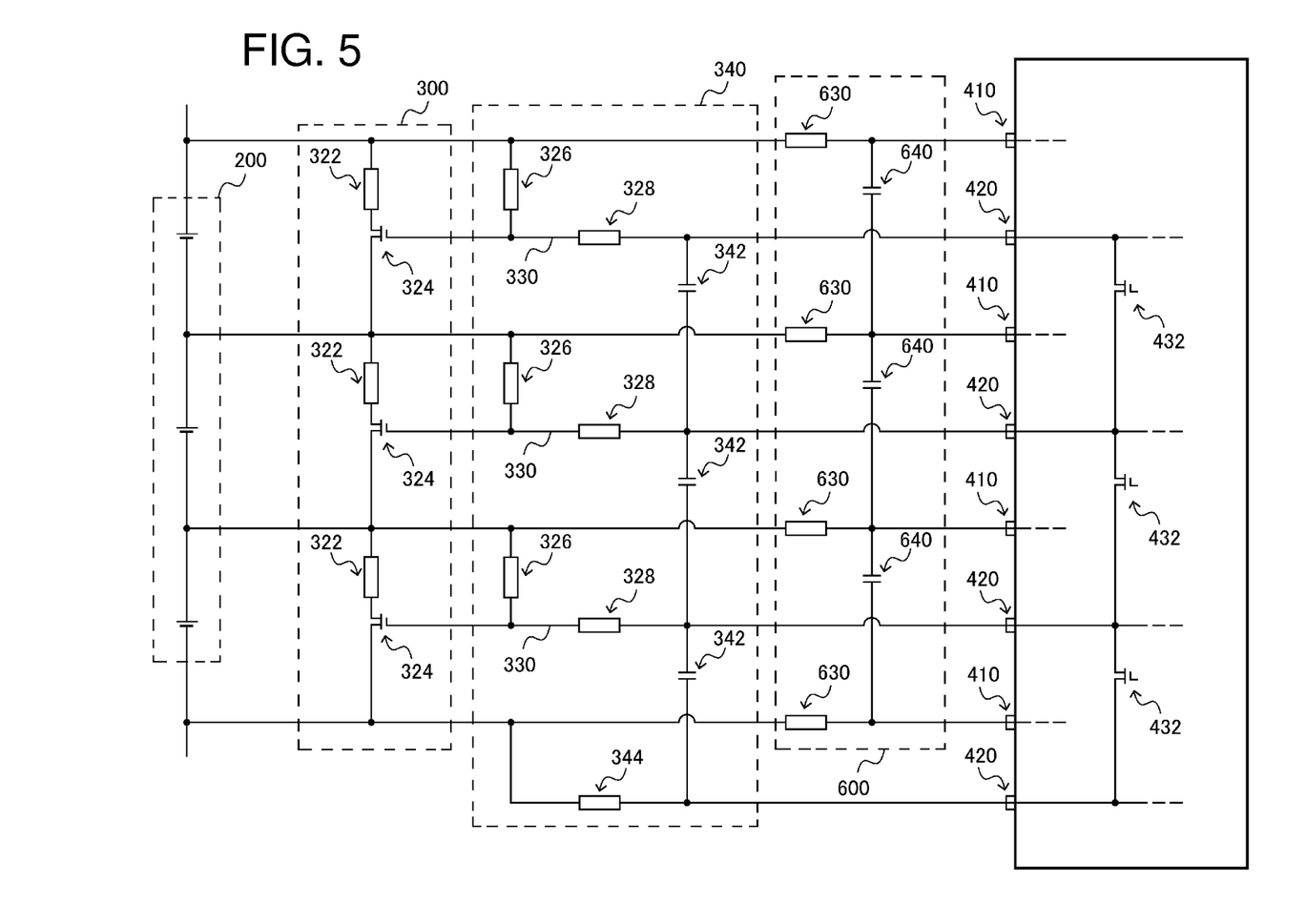
FIG. 5 is a circuit diagram of a power supply device of one aspect for embodying the power supply device of FIG. 4.

FIG. 5 illustrates power supply device 100 of one aspect for embodying the power supply device shown in FIG. 4. Assembled battery 200 includes three battery cells connected in series. Power supply device 100 includes four measurement lines each obtaining an analog signal. Each measurement line is connected to an output terminal of each battery cell. Note here that configurations of first filter unit 600 and status-monitoring unit 400 are the same as those of the first exemplary embodiment, description thereof is omitted herein.

Discharge unit 300 includes a plurality of discharge resistors 322 each connecting a pair of measurement lines connected to positive and negative output terminals of a battery cell, and semiconductor switches 324 connected in series to discharge resistors 322. A plurality of signal lines, which are provided to control a working status of semiconductor switch 324, are connected to each of semiconductor switches 324. Specifically, in power supply device 100 of FIG. 5, the semiconductor switch includes a FET (field effect transistor). Pull-up resistor 326 and gate resistor 328 are connected to a gate of the FET. Each pull-up resistor 326 is connected to a positive electrode-side measurement line of the corresponding battery cell such that it is connected between the gate and the source of the FET. Each gate resistor 328 is connected to the terminal of the corresponding second connection terminal 420. Each pull-up resistor 326 and each gate resistor 328 form a signal line for controlling the working status of the corresponding FET.

The FET structurally includes parasitic capacitance and parasitic inductance, which may cause various problems. In order to solve such problems, gate resistor 328 is connected to the gate of the FET. Specifically, gate resistor 328 of the FET plays a role of preventing oscillation between the gate and the source, protecting the FET, adjusting the switching speed of the FET, and the like. In a typical circuit constant, a resistor in a range from several tens of Ω to several hundreds of Ω is used.

In the FET, the working status is controlled by a voltage applied to the gate. Specifically, when a High-level signal is input to the gate, the FET is controlled to be off. Meanwhile, when a Low-level signal is input to the gate, the FET is controlled to be on. By providing pull-up resistor 326 between the source and the gate, when the FET is controlled to be off, a signal level can be fixed to High. Pull-up resistor 326 of FET may have any values as long as it is not more than a resistance value capable of securing the minimum electric current input to IC and not less than the resistance value capable of fixing the signal level to be high when the FET is controlled to be on. Therefore, from the various conditions such as the circuit constant, the range of the resistance value to be used as a pull-up resistor is obtained. In the range, an appropriate resistance value can be selected from the viewpoint of a consumption current or noise resistance. For example, in a typical circuit constant, the range of the resistance value functioning as a pull-up resistor is in a relatively wide range from 50Ω to 100 kΩ. Actually, when the consumption current is considered, a resistor having a range from 1 kΩ to 100 kΩ is often used.

Note here that depending on types of semiconductor switches to be used, relation between the signal level and a switch operation may be changed. Also when such a semiconductor switch is used, a resistor for fixing the signal level is similarly needed. Therefore, description thereof is omitted herein.

Second filter section 340 include a plurality of second capacitors 342 for connecting gates of FETs and second filter resistors connected in series to second capacitors 342. The second filter resistor includes the above-mentioned pull-up resistor 326 and gate resistor 328, and is also used as a resistor for a control signal of FET. Furthermore, since a terminal having the lowest electric potential among the plurality of second connection terminals 420 does not have a corresponding FET, and therefore, is not connected to the gate of the FET. However, the terminal is connected to a measurement line at the negative electrode side of the corresponding battery cell via second filter resistor 344 because it is necessary to form a path for returning electric current.

As mentioned above, resistance values of gate resistor 328 and pull-up resistor 326 can be selected relatively freely as long as they satisfy the respective conditions. In the second exemplary embodiment of the present invention, by using this characteristics, the signal line of semiconductor switch 324 can be prevented with second filter section 340. As mentioned above, second filter section 340 is a low-pass filter, and the time constant is determined based on the resistance value of the second filter resistor and capacity of second capacitor 342. Since the cutoff frequency of a low-pass filter is determined based on the time constant, in order to obtain the optimum characteristics as the low-pass filter, it is necessary to select a resistor and a capacitor having an optimum resistance value and capacity, respectively. In the second exemplary embodiment, pull-up resistor 326 and gate resistor 328 are provided between second connection terminal 420 and output terminal of the battery cell. However, as mentioned above, since the resistance value can be selected from relatively wide range, pull-up resistor 326 and gate resistor 328 can be used also as a second filter resistor constituting second filter section 340.

In the power supply device mentioned above, an analog signal, in which a high-frequency component is attenuated, can be input to not only first detection section 440 but also second detection section 450. Accordingly, the detection accuracy of second detection section 450 can be input. Furthermore, according to the configuration of the second exemplary embodiment, since the discharge resistor is not connected to the second connection terminal, the circuit constant of the discharge resistor can be set relatively freely. Therefore, a power supply device provided with a high-capacity assembled battery and having large variation in capacity preferably employs the configuration of the second exemplary embodiment.

Figure 6:
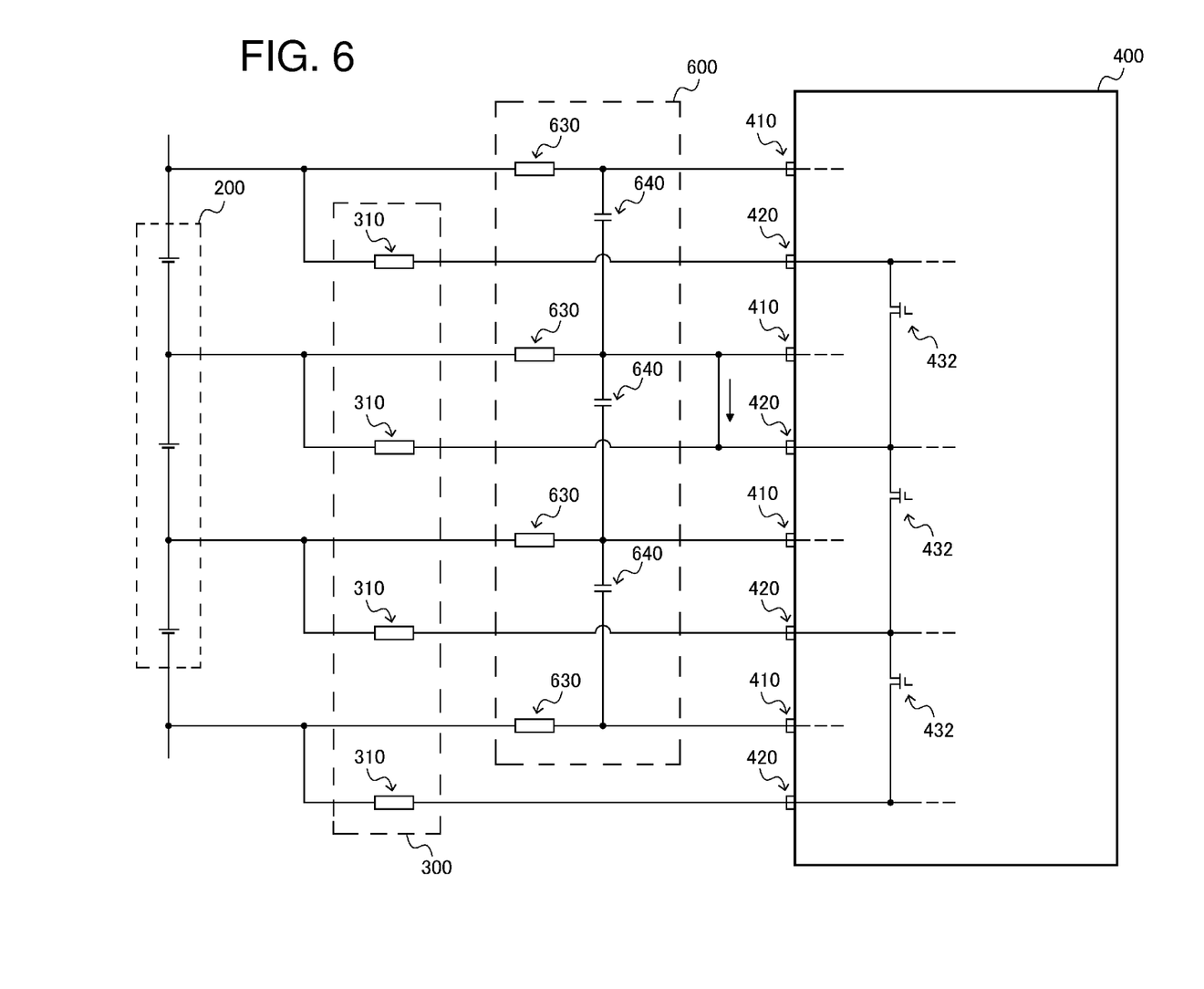
FIG. 6 is a circuit diagram for illustrating a state in which short circuit occurs between terminals in the circuit diagram of FIG. 3.

Next, based on a power supply device of FIG. 6, a short-circuit detection method according to the exemplary embodiment of the present invention is described. Note here that short-circuit detection can be carried out by the similar processing as in the second exemplary embodiment although the description thereof is omitted herein.

As mentioned above, as shown in FIGS. 3 and 5, in an actual integrated circuit, terminals of first connection terminal 410 and terminals of second connection terminal 420 are alternately disposed so that a potential difference between adjacent terminals become smaller. Therefore, as illustrated in FIG. 6, the first connection terminal and the second connection terminal having the same electric potential may be short-circuited. In FIG. 6, it is assumed that the terminal having the second highest electric potential among a plurality of first connection terminals 410 and a terminal having the second highest electric potential among a plurality of second connection terminals 420 are short-circuited. When a short circuit as shown in FIG. 6 occurs, since large change does not occur in the measurement value detected by voltage measurement section 442 (electric potential of the terminal of first connection terminal 410), the short circuit cannot be detected as it is.

In the exemplary embodiment of the present invention, in order to detect a short-circuit state of the terminal of first connection terminal 410 and the terminal of second connection terminal 420 having the same electric potential as shown in FIG. 4, a short circuit is determined by short-circuit determination using switch 432 of switch control section 430. Specifically, as shown in FIG. 1, power supply device 100 includes determination unit 500 to which detection results of the voltage measurement section 442 can be input. Determination unit 500 compares a voltage value detected by voltage measurement section 442 when switch 432 of switch control section 430 is in an on state, with a voltage value detected by voltage measurement section 442 when switch 432 of switch control section 430 is in an off state, and determines whether an electric current path connecting the first connection terminal to the second connection terminal is short-circuited. Specifically, determination unit 500 calculates a difference between two voltage values detected depending on the working status of switch 432 of switch control section 430. When the calculated difference is changed by not less than a threshold that is set in advance, determination unit 500 determines that the terminal of second connection terminal 420 corresponding to the controlled switch 432 is short circuited.

As mentioned above, only when a short circuit shown in FIG. 6 occurs, a large change does not occur in the measurement value detected by voltage measurement section 442. Therefore it is difficult to detect a short circuit. However, when switch 432 corresponding to a second connection terminal in which a short circuit occurs is controlled to be on, a path in which an electric current flows is different between a case where short-circuit occurs and a case where short-circuit does not occur. Therefore, a relatively large change occurs in a measurement value detected by voltage measurement section 442. As mentioned above, the exemplary embodiment of the present invention is configured to determine a short circuit using such a voltage change.

Figure 7:
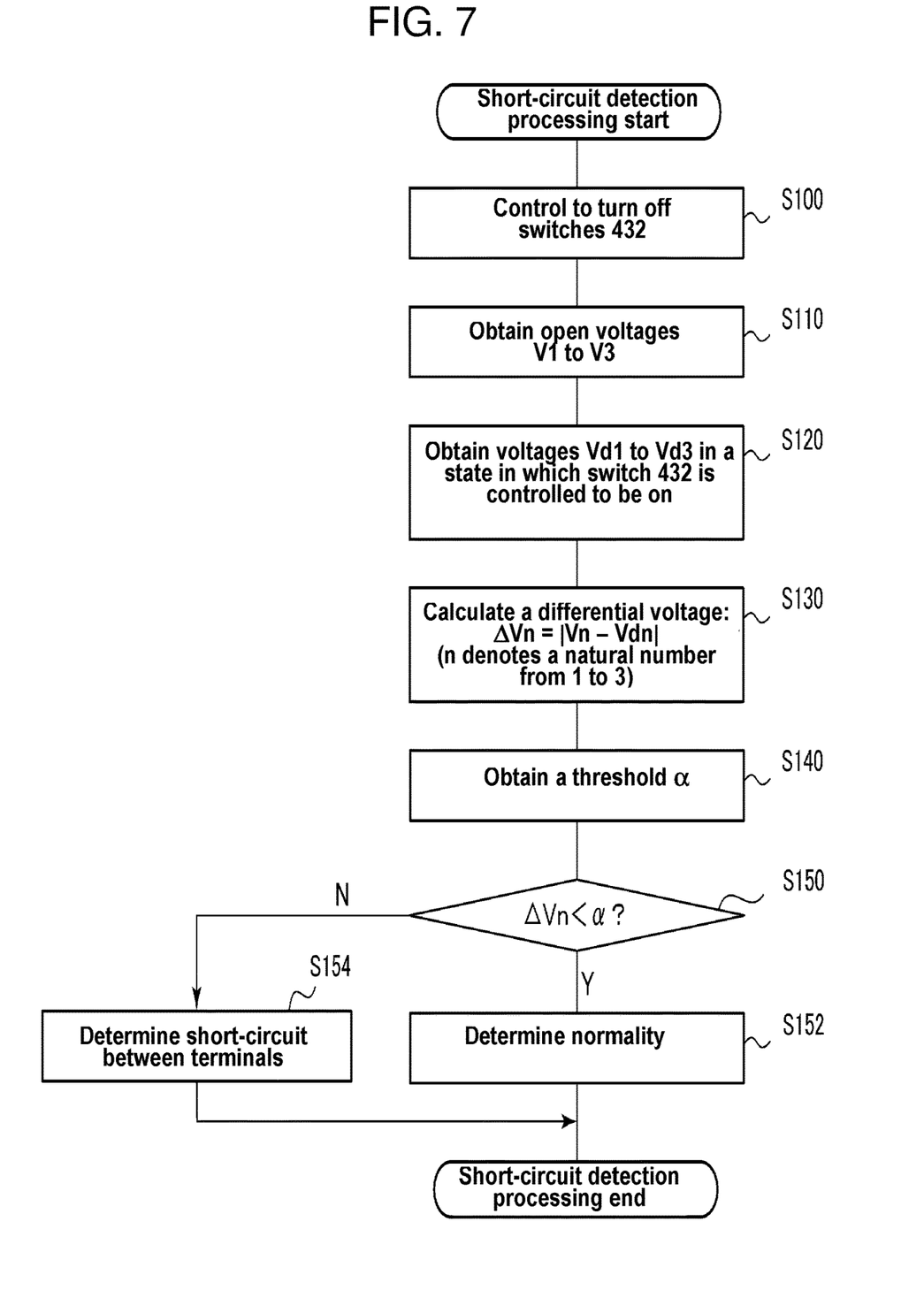
FIG. 7 is a flowchart illustrating a flow of a short-circuit detection processing in the power supply device of the present invention.

FIG. 7 is a flowchart illustrating a flow of a short-circuit detection processing of power supply device 100 according to the exemplary embodiment of the present invention. When the short-circuit detection processing of FIG. 7 is started, switch control section 430 controls to turn off all switches 432 (S100). Assembled battery 200 is cut off from the load by a vehicle-side control circuit (not shown), and voltage measurement section 442 obtains open voltages V1 to V3 of the battery cells constituting an assembled battery (S110). Next, switches 432 of switch control section 430 are sequentially controlled to be on, in a state in which switch 432 is controlled to be on, voltage measurement section 442 obtains voltages Vd1 to Vd3 of battery cells constituting an assembled battery (S120). Note here that in S120, all the switches other than a switch that is controlled to be on among plurality of switches 432 are controlled to be off in order to prevent switches 432 of switch control section 430 being controlled to be on simultaneously. Determination unit 500 calculates a differential voltage: $\Delta Vn = |Vn - Vdn|$ (n denotes a natural number from 1 to 3) based on open voltages V1 to V3 of battery cells and voltages Vd1 to 3 detected in a state in which switch 432 is controlled to be on (S130). Determination unit 500 obtains a threshold α that is stored in advance (S140). Determination unit 500 compares the calculated differential voltage $\Delta Vn$ with the threshold α. As a result of the comparison, when the differential voltage ΔVn is smaller than the threshold α (Y in S150), determination unit 500 determines that the power supply device is normal (S152). Furthermore, determination unit 500 compares the calculated differential voltage ΔVn with the threshold α that is stored in advance. As a result of the comparison, when the differential voltage ΔVn is smaller than the threshold α (N in S150), determination unit 500 determines that the terminal of first connection terminal 410 and the terminal of second connection terminal 420 are short-circuited (S154). Determination unit 500 outputs determination result to the outside and ends the short-circuit detection processing.

As mentioned above, the present invention is described with reference to the exemplary embodiments. These exemplary embodiments are only examples. A person skilled in the art would understand that combinations of components or processing processes can be variously modified, and such modifications are also encompassed in the scope of the present invention.

The invention claimed is:

1. A power supply device comprising:
   an integrated circuit having a built-in status-monitoring unit for monitoring a status of battery cells, comprising:
      a plurality of first connection terminals and a plurality of second connection terminals for receiving inputs of electrical signals:
      a first detection section connected to the plurality of first connection terminals, for obtaining the electrical signals input to the plurality of first connection terminals;
      a second detection section connected to the plurality of second connection terminals;
      a plurality of switches configured to connect adjacent second connection terminals among the plurality of second connection terminals, the plurality of switches being connected to each other in series; and
      a switch control section for controlling working statuses of the plurality of switches,
   wherein one of the first connection terminals and one of the second connection terminals are connected to the same corresponding one of the battery cells, and
   wherein the switch control section controls to turn off the plurality of switches and causes the electrical signals input to the plurality of second connection terminals to be input to the second detection section, and controls to turn on a predetermined switch among the plurality of switches and brings adjacent second connection terminals into electrical conduction state,
   and further comprising:
      an assembled battery including the battery cells;
      a first filter unit configured to obtain electrical signals from the battery cells, attenuate a predetermined frequency component of the electrical signals, and outputs electrical signals to the plurality of first connection terminals, and
      a plurality of discharge resistors for connecting the battery cells to the plurality of second connection terminals, respectively, the plurality of discharge resistors being disposed outside the integrated circuit,
      wherein the switch control section
         controls to turn on the predetermined switch among the plurality of switches, for discharging one of the battery cells corresponding to the switch via the plurality of discharge resistors, and
         controls to turn off the plurality of switches, for causing electrical signals obtained from the battery cells to be input to the second detection section via the plurality of discharge resistors.

2. The power supply device according to claim 1, further comprising:
   a discharge unit including a plurality of semiconductor switches connected in parallel to the battery cells, and a plurality of signal lines for controlling operations of the plurality of switches,
   wherein the plurality of signal lines each are connected to an output terminal of a corresponding one of the battery cells, and a corresponding one terminal of the plurality of second connection terminals, respectively,
   the switch control section
      controls to turn on a predetermined switch among the plurality of switches, for controlling to turn on a corresponding one of the plurality of switches, and
      controls to turn off ones of the plurality of switches, for allowing electrical signals obtained from the battery cells to be input to the second detection section via the plurality of signal lines.

3. A power supply device, comprising:
   an integrated circuit having a built-in status-monitoring unit for monitoring a status of battery cells, comprising:
      a plurality of first connection terminals and a plurality of second connection terminals for receiving inputs of electrical signals:
      a first detection section connected to the plurality of first connection terminals, for obtaining the electrical signals input to the plurality of first connection terminals;
      a second detection section connected to the plurality of second connection terminals;
      a plurality of switches configured to connect adjacent second connection terminals among the plurality of second connection terminals, the plurality of switches being connected to each other in series; and
      a switch control section for controlling working statuses of the plurality of switches,
   wherein one of the first connection terminals and one of the second connection terminals are connected to the same corresponding one of the battery cells, and
   wherein the switch control section controls to turn off the plurality of switches and causes the electrical signals input to the plurality of second connection terminals to be input to the second detection section, and controls to turn on a predetermined switch among the plurality of switches and brings adjacent second connection terminals into electrical conduction state,
   further comprising:
      an assembled battery including a plurality of battery cells;
      a first filter unit configured to obtain electrical signals from the plurality of battery cells, attenuates a predetermined frequency component of the electrical signals, and outputs electrical signals to the first connection terminals; and
      a discharge unit including a plurality of semiconductor switches connected in parallel to the plurality of battery cells, and a plurality of signal lines for controlling operations of the plurality of semiconductor switches,
   wherein the plurality of signal lines each are connected to an output terminal of a corresponding one of the plurality of battery cells, and a corresponding one terminal of the plurality of second connection terminals, respectively, the switch control section
controls to turn on a predetermined switch among the plurality of switches, for controlling to turn on a corresponding one of the plurality of semiconductor switches, and controls to turn off ones of the plurality of switches, for allowing electrical signals obtained from the plurality of battery cells to be input to the second detection section via the plurality of signal lines, wherein the plurality of semiconductor switches each are a field effect transistor (FET) having a gate to which one of the plurality of signal lines is connected, and each of the plurality of signal lines includes a pull-up resistor connected to an output terminal of a corresponding one of the plurality of battery cells and the gate of the FET, and a gate resistor connected to a terminal of a corresponding one of the plurality of second connection terminals and the gate of the FET, and further the power supply device comprises a second filter section including a plurality of capacitors for connecting each of the plurality of signal lines, and a filter resistor configured of the pull-up resistor and the gate resistor.

4. The power supply device according to claim 1, wherein the first detection section includes a voltage detection circuit for measuring a voltage of a corresponding one of the battery cells from an input electrical signal.

5. The power supply device according to claim 4, further comprising a determination unit that compares a plurality of voltages detected by the voltage detection circuit, depending on the working statuses of the plurality of switches, and determines whether an electric current path connecting one of the first connection terminals to one of the second connection terminals is short-circuited.

6. The power supply device according to claim 5, wherein the determination unit is configured to compare a voltage detected by the voltage detection circuit when any switch among the plurality of switches is controlled to be on with a voltage detected by the voltage detection circuit when the switch is controlled to be off, and to determine that one of the first connection terminals and one of the second connection terminals are short-circuited when a difference between the detected voltages is equal to or larger than a predetermined determination threshold that is set in advance.

7. The power supply device according to claim 1, wherein the switch control section controls the working statuses of the plurality of switches so that two switches, among the plurality of switches, connected to an identical terminal of the second connection terminals are prevented from being turned on simultaneously.

8. The power supply device according to claim 2, wherein the first detection section includes a voltage detection circuit for measuring a voltage of a corresponding one of the battery cells from an input electrical signal.

9. The power supply device according to claim 3, wherein the first detection section includes a voltage detection circuit for measuring a voltage of a corresponding one of the plurality of battery cells from an input electrical signal.

10. The power supply device according to claim 8, further comprising a determination unit that compares a plurality of voltages detected by the voltage detection circuit, depending on the working statuses of the plurality of switches, and determines whether an electric current path connecting one of the first connection terminals to one of the second connection terminals is short-circuited.

11. The power supply device according to claim 9, further comprising a determination unit that compares a plurality of voltages detected by the voltage detection circuit, depending on the working statuses of the plurality of switches, and determines whether an electric current path connecting one of the first connection terminals to one of the second connection terminals is short-circuited.

12. The power supply device according to claim 10, wherein the determination unit is configured to compare a voltage detected by the voltage detection circuit when any switch among the plurality of switches is controlled to be on with a voltage detected by the voltage detection circuit when the switch is controlled to be off, and to determine that one of the first connection terminals and one of the second connection terminals are short-circuited when a difference between the detected voltages is equal to or larger than a predetermined determination threshold that is set in advance.

13. The power supply device according to claim 11, wherein the determination unit is configured to compare a voltage detected by the voltage detection circuit when any switch among the plurality of switches is controlled to be on with a voltage detected by the voltage detection circuit when the switch is controlled to be off, and to determine that one of the first connection terminals and one of the second connection terminals are short-circuited when a difference between the detected voltages is equal to or larger than a predetermined determination threshold that is set in advance.

14. The power supply device according to claim 1, wherein
each of the discharge resistors has a node between an output terminal of a battery cell and an input terminal of the first filter unit.

* * * * *